United States Patent
Yamaguchi et al.

(10) Patent No.: US 10,451,943 B2
(45) Date of Patent: Oct. 22, 2019

(54) METHOD FOR MANUFACTURING ACTIVE MATRIX ARRAY DEVICE, AND ACTIVE MATRIX ARRAY DEVICE MANUFACTURED THEREBY

(71) Applicant: PI-CRYSTAL INCORPORATION, Osaka-shi, Osaka (JP)

(72) Inventors: Seiichiro Yamaguchi, Osaka (JP); Junichi Takeya, Osaka (JP); Masataka Itoh, Osaka (JP); Norikazu Shomoto, Osaka (JP); Mina Uematsu, Osaka (JP)

(73) Assignee: PI-CRYSTAL INC., Chiba (JP)

( * ) Notice: Subject to any disclaimer, the term of this patent is extended or adjusted under 35 U.S.C. 154(b) by 0 days.

(21) Appl. No.: 15/567,326

(22) PCT Filed: Apr. 20, 2016

(86) PCT No.: PCT/JP2016/063615
§ 371 (c)(1),
(2) Date: Oct. 17, 2017

(87) PCT Pub. No.: WO2016/171285
PCT Pub. Date: Oct. 27, 2016

(65) Prior Publication Data
US 2018/0107083 A1 Apr. 19, 2018

(30) Foreign Application Priority Data
Apr. 20, 2015 (JP) .................... 2015-085644

(51) Int. Cl.
*G02F 1/1333* (2006.01)
*G02F 1/1362* (2006.01)
(Continued)

(52) U.S. Cl.
CPC ...... *G02F 1/136286* (2013.01); *G02F 1/1333* (2013.01); *G02F 1/1368* (2013.01);
(Continued)

(58) Field of Classification Search
CPC .. G02F 1/136; G02F 1/1368; G02F 1/136286; G02F 1/13439; G02F 1/136227;
(Continued)

(56) References Cited

U.S. PATENT DOCUMENTS

| 5,339,180 A | 8/1994 | Katoh |
| 2003/0223138 A1 | 12/2003 | Akiyama |

(Continued)

FOREIGN PATENT DOCUMENTS

| JP | 2002-009290 | 1/2002 |
| JP | 2003-289136 | 10/2003 |

(Continued)

OTHER PUBLICATIONS

Extended European Search Report issued in corresponding European Application No. 16783306.0, dated Nov. 20, 2018, 10 pages.

*Primary Examiner* — Thoi V Duong
(74) *Attorney, Agent, or Firm* — Hamre, Schumann, Mueller & Larson, P.C.

(57) ABSTRACT

Active matrix array devices are constituted by devices that have a function such as those of a display/light emitting device, a sensor, a memory or an actuator, and are arranged in a matrix array shape, and the expansion of usage in various fields and applications is expected. However, there is little similarity and compatibility in the forming process and materials between a device such as a display/light emitting device, a sensor, a memory, or an actuator, and a circuit portion that controls such a device in the matrix element, and therefore the device and the circuit portion are mutually restricting factors. This results in an increase in the manufacturing cost and limitation of the function.

A conventional active matrix array device is manufactured by performing various process steps on the same substrate. Control circuit portions each including a transistor are formed in some of the process steps. In contrast, the problem (Continued)

described above is solved by forming the control circuit portions of an active matrix array device on a substrate different from that of other portions, and the control circuit portions are respectively mounted on matrix elements in a middle step of the manufacturing process of the matrix array body or after a final step thereof.

6 Claims, 5 Drawing Sheets

(51) Int. Cl.
| | | |
|---|---|---|
| *G02F 1/1343* | (2006.01) | |
| *G02F 1/1368* | (2006.01) | |
| *G09F 9/30* | (2006.01) | |
| *H01L 29/786* | (2006.01) | |
| *H01L 51/05* | (2006.01) | |
| *H01L 27/12* | (2006.01) | |
| *H01L 27/32* | (2006.01) | |
| *G02F 1/136* | (2006.01) | |

(52) U.S. Cl.
CPC .. *G02F 1/133345* (2013.01); *G02F 1/134309* (2013.01); *G09F 9/30* (2013.01); *H01L 27/1259* (2013.01); *H01L 27/3274* (2013.01); *H01L 29/786* (2013.01); *H01L 51/05* (2013.01); *G02F 2001/13613* (2013.01)

(58) Field of Classification Search
CPC ............. G02F 1/1333; G02F 1/133345; G02F 1/134309; G02F 1/1362; G02F 1/133305; G02F 1/1343; G02F 1/13452; G02F 1/134336; G02F 1/1345; G02F 1/133723; G02F 2001/136231; G02F 2001/13629; G02F 2001/133354; G02F 2001/133357; G02F 2001/133368; G02F 2201/122; G02F 2001/13613; H01L 27/12; H01L 27/3276; H01L 27/3248; H01L 29/4908; H01L 29/41733; H01L 29/78678; H01L 21/28; H01L 21/823462; H01L 2221/68386; H01L 2224/18; H01L 2224/73253; H01L 22/32; H01L 23/5226; H01L 23/535; H01L 23/5384; H01L 23/5385; H01L 29/786; H01L 51/05; H01L 27/1259; H01L 27/3274; G09F 9/30

See application file for complete search history.

(56) References Cited

U.S. PATENT DOCUMENTS

| | | |
|---|---|---|
| 2003/0227584 A1 | 12/2003 | Onozuka et al. |
| 2004/0195569 A1 | 10/2004 | Hashimoto et al. |
| 2006/0079010 A1 | 4/2006 | Hara et al. |
| 2006/0172470 A1 | 8/2006 | Hara et al. |
| 2008/0197348 A1 | 8/2008 | Matsubara et al. |
| 2010/0039357 A1 | 2/2010 | Cok et al. |

FOREIGN PATENT DOCUMENTS

| | | |
|---|---|---|
| JP | 2003-318195 | 11/2003 |
| JP | 2004-228373 | 8/2004 |
| JP | 2005-202279 | 7/2005 |
| JP | 2006-196712 | 7/2006 |
| JP | 2007-123603 | 5/2007 |
| JP | 2008-058468 | 3/2008 |
| JP | 2008-235861 | 10/2008 |
| JP | 2011-530723 | 12/2011 |
| JP | 2012-048094 | 3/2012 |
| JP | 2013-135180 | 7/2013 |

METHOD FOR MANUFACTURING ACTIVE MATRIX ARRAY DEVICE, AND ACTIVE MATRIX ARRAY DEVICE MANUFACTURED THEREBY

TECHNICAL FIELD

The present invention relates to methods for manufacturing active matrix array devices, and specifically relates to a manufacturing method in which control circuits provided for respective matrix elements are formed on a substrate that is different from that of an active matrix array device, and the control circuits are mounted on the active matrix array device so as to he arranged on the respective matrix elements.

BACKGROUND ART

Active matrix array devices are constituted by devices having a function such as those of display/light emitting devices, sensors, memories, or actuators, and are arranged in a matrix array shape, and are used in various fields and applications.

Active matrix array devices are structured based on matrix elements in each of which a device such as a display or a sensor and a circuit that controls the device are included as a unit, and a conductor (interconnect) group in which conductors extend in a row direction and a column direction of the matrix so as to transmit a control signal or the like to each of the matrix elements. The row interconnects and the column interconnects intersect inside the respective matrix elements or adjacent regions thereof. The control circuit that constitutes a matrix element differs in complexity ranging from a circuit constituted by one transistor to a circuit that is complex, depending on the application. Also, in the case where the device of the matrix element is a sensor, an interconnect for transmitting an output signal of the sensor is added to the basic structure.

The field in which the application of active matrix array devices is most widespread is the field of display. Liquid crystal display is the most widely used in the field of display. In the case of liquid crystal display, a pixel that is constituted by a liquid crystal layer interposed between electrodes and a thin film transistor (TFT) for applying a voltage thereto corresponds to the matrix element, and the row interconnect is referred to as a gate line and the column interconnect is referred to as a data line or the like. Devices in which sensors are arranged in an active matrix array are expected as new future application examples.

In addition, in recent years, semiconductor technology in which an organic material is used has advanced, and it can be said that an organic TFT that uses an organic semiconductor can be applied as the control circuit of a matrix element. The organic TFT can be formed on a soft and bendable film at a low cost, and therefore the creation of a new application field, namely a flexible active matrix array device, is expected.

In the case of a conventional field of display that is already at a mature stage, a high temperature is required to form a TFT, and an active matrix array device needs to be formed on a glass substrate having high heat resistance, and therefore increasing the size of the device is difficult due to limitations in reducing the weight of the device, and in terms of manufacturing process technology, or manufacturing costs. However, as a result of reducing the weight of the substrate by adopting the organic TFT technology this problem can be avoided, and a large-size display aimed at being installed outdoors, in a large commercial complex, a hall, or the like can be manufactured using an active matrix array method.

Accordingly, the creation of a new application field of the active matrix array device can be expected in this way, but there is a common issue irrespective of the application field. That is, there is little similarity and compatibility between processes and materials for forming the control circuits of the matrix elements and those for forming other portions. Therefore, the control circuits and the other portions are mutually restricting factors in terms of selection of materials and process conditions, and as a result, the product specification of the device is restricted, and the manufacturing cost increases. Also, the control circuits, although being arranged in the entire matrix array often have a small area ratio relative to the entire device. This incurs wasteful material consumption and hidden increases in the manufacturing cost that cannot be directly seen.

PRIOR ART DOCUMENT

Patent Document

Patent Document 1 JP 2008-235861A

DISCLOSURE OF INVENTION

Problem to be Solved by the Invention

The problem to be solved by the present invention is, in an active matrix array device, to suppress constrains incurred in the product specification of the active matrix array device and suppress an increase in the manufacturing cost thereof, which is caused by the differences in manufacturing steps and the differences in properties of materials between the control circuits and the other portions.

Means for Solving Problem

A conventional active matrix array device is manufactured by performing various process steps performed on the same substrate. Control circuit portions each including a transistor are formed in some of the process steps. In contrast, the present invention is characterized in that the problem described above is solved by forming the control circuit portions of an active matrix array device on a substrate different from that of other portions (matrix array body), and the control circuit portions are respectively mounted on matrix elements in a middle step of the manufacturing process of the matrix array body or after a final step thereof.

EFFECTS OF THE INVENTION

According to the present invention, only the control circuit portions can be formed collectively on a substrate having an area that is substantially smaller than that of the entire active matrix array device, and therefore the manufacturing apparatuses for this portion can be downsized. Also, only good circuits of the formed control circuits can be selectively mounted, and as a result, the yield of good products of the overall device can be improved. Accordingly the manufacturing cost can be substantially reduced. Specifically, the larger the size of the active matrix array device, or the more complex the control circuit, the more the effect is enhanced. In addition, devices that were difficult to realize due to constrains incurred by the differences between the control circuits and the matrix array body with respect to the properties of materials and the manufacturing processes, that is, a large-size display that is to be installed outdoors, for example, can be easily realized or the like by using a conventional technology such as a liquid crystal, an organic EL, or electronic paper.

BRIEF DESCRIPTION OF DRAWINGS

FIG. 4b is a cross-sectional view of the matrix element control circuit taken along line A in FIG. 4a.

FIG. 4c is a cross-sectional view of the matrix element control circuit taken along line B in FIG. 4a.

DESCRIPTION OF THE INVENTION

Hereinafter, an embodiment of the present invention will be described in detail with reference to the drawings.

In the present working example, an application example in Which a large-size liquid crystal display panel serves as an active matrix array device and an organic TFT serves as a control circuit of a pixel, which is a matrix element, will be described.

Figure 1:
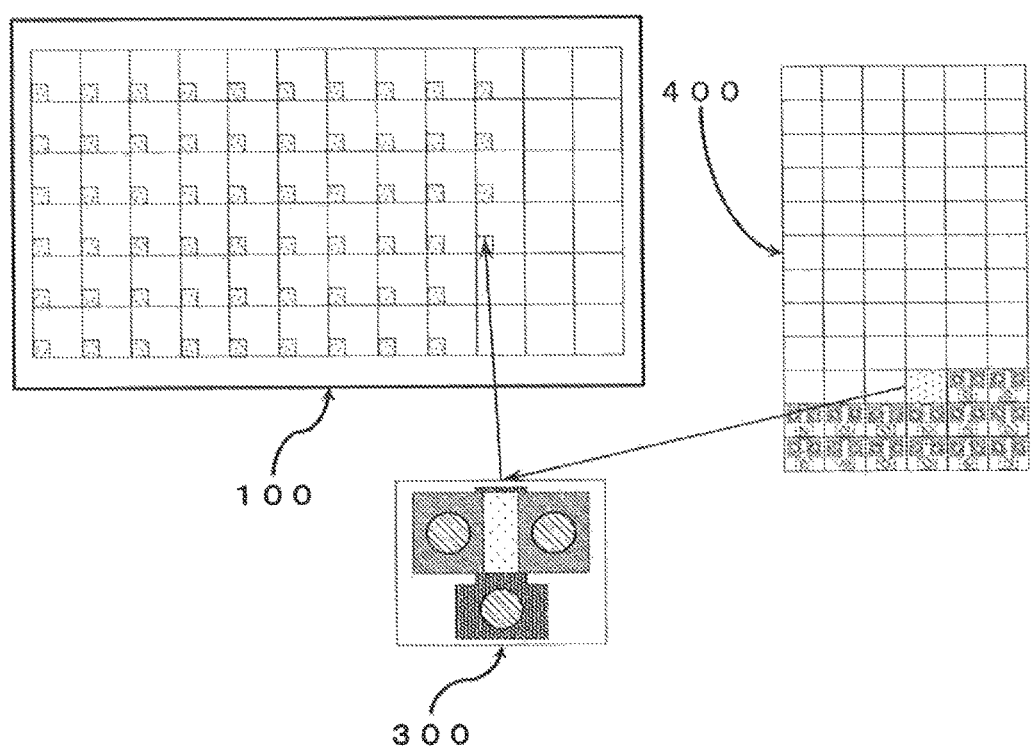
FIG. 1 is a diagram illustrating a basic concept of the present invention.

FIG. 1 is a diagram illustrating a basic concept of the present invention, and is a top view of a liquid crystal display panel body 100, an organic TFT 300 serving as a matrix element control circuit, and a substrate 400 on which a plurality of organic TFTs are formed. The matrix element control circuit is constituted by only one organic TFT in the present working example, and is formed on a different substrate 400 using an organic TFT process. FIG. 1. shows the state in which formed organic TFTs are separated from the substrate 400, and are respectively mounted in a face-down manner at predetermined positions on the liquid crystal display panel body 100.

Figure 2:
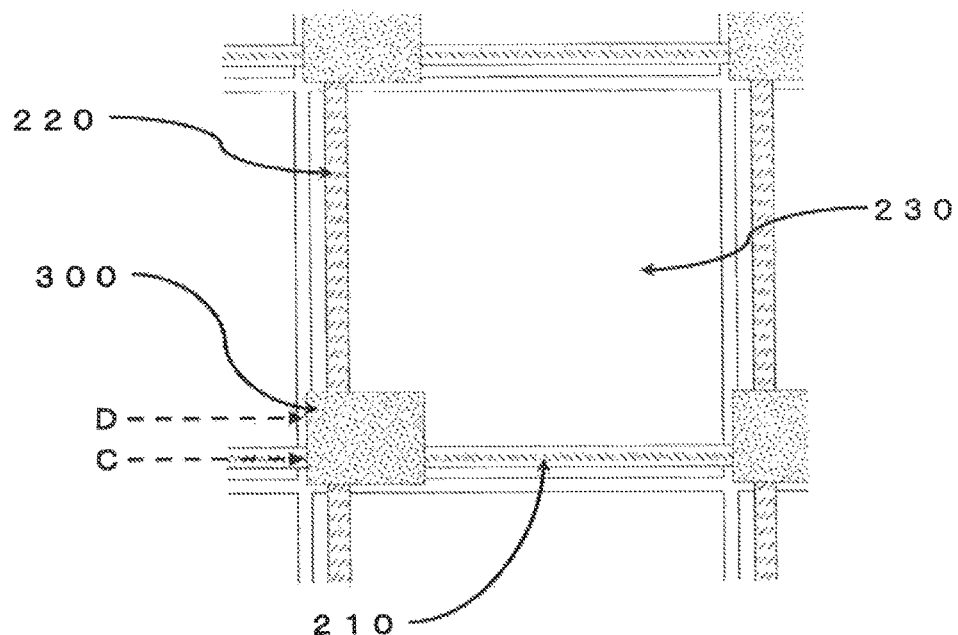
FIG. 2 is a diagram illustrating one matrix element on an active matrix array device.

FIG. 2 shows an upper surface in the state in which the organic TFT 300 is mounted on a pixel, which is a matrix element, in a face-down manner. Although not illustrated in the diagram, a gate line 210, a data line 220, and a pixel electrode 230 are respectively electrically connected to a gate electrode, a source electrode, and a drain electrode of the organic TFT 300.

Figure 3:
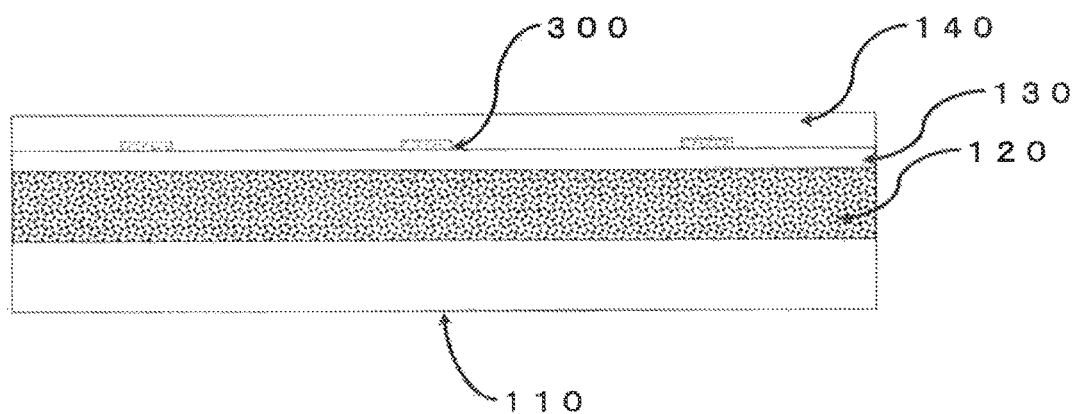
FIG. 3 is a diagram schematically illustrating a cross-sectional structure of a liquid crystal panel according to one embodiment of the present invention.

FIG. 3 schematically shows a cross-sectional structure of the liquid crystal display panel 100, which is a present working example. In the diagram, the display surface of the liquid crystal display panel is on the lower side, and a substrate layer 110, a liquid crystal layer 120, an interconnect/electrode layer 130, organic TFTs 300, and a cover film layer 1.40 of the liquid crystal display panel in the manufacturing process of the present working example are shown. In the diagram, general members needed to constitute a liquid crystal display panel such as a polarizing plate and a color filter are omitted. That is, in the substrate layer 110, a polarizing plate, a transparent substrate, a color filter, a counter electrode, an alignment film, and the like are laminated, the interconnect/electrode layer 130 includes the pixel electrodes 230, the gate lines 210, and the data lines 220 that are formed on the alignment film in a predetermined layout, and the cover film layer 140 includes a polarizing plate that is laminated on a sealing film of the organic TFTs.

In the manufacturing process of the liquid crystal display panel 100, the organic TFTs 300 are mounted after the interconnect/electrode layer 130 is formed, and the cover film layer 140 is formed thereon. In the present working example, a method is adopted in which a liquid crystal is injected between the pre-formed substrate layer 110 and a laminated substrate in which the organic TFTs 300 are mounted on the interconnect/electrode layer 130 and the cover film layer 140 is formed thereon. However, the order of these steps is irrelevant to the essence of the present invention, and the order of the steps may be optimized according to the used materials or the like, and does not limit the applicable range of the present invention.

Figure 4A:
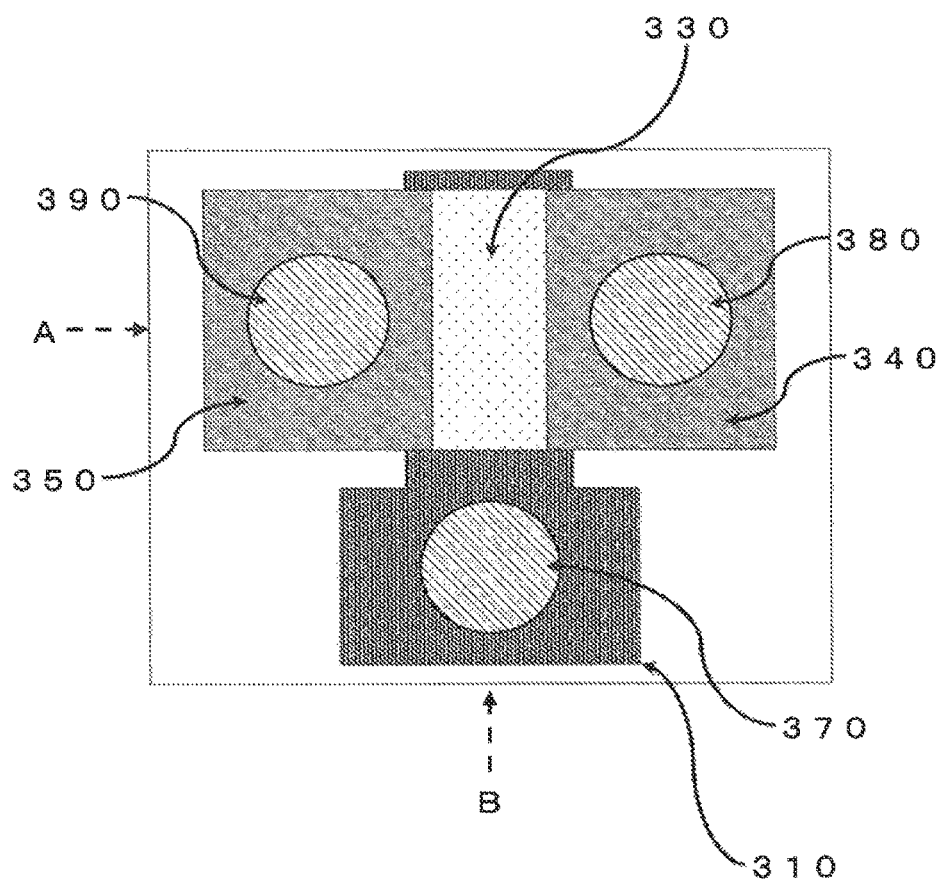
FIG. 4a is a top view of a matrix element control circuit according to one embodiment of the present invention.
Figure 4B:
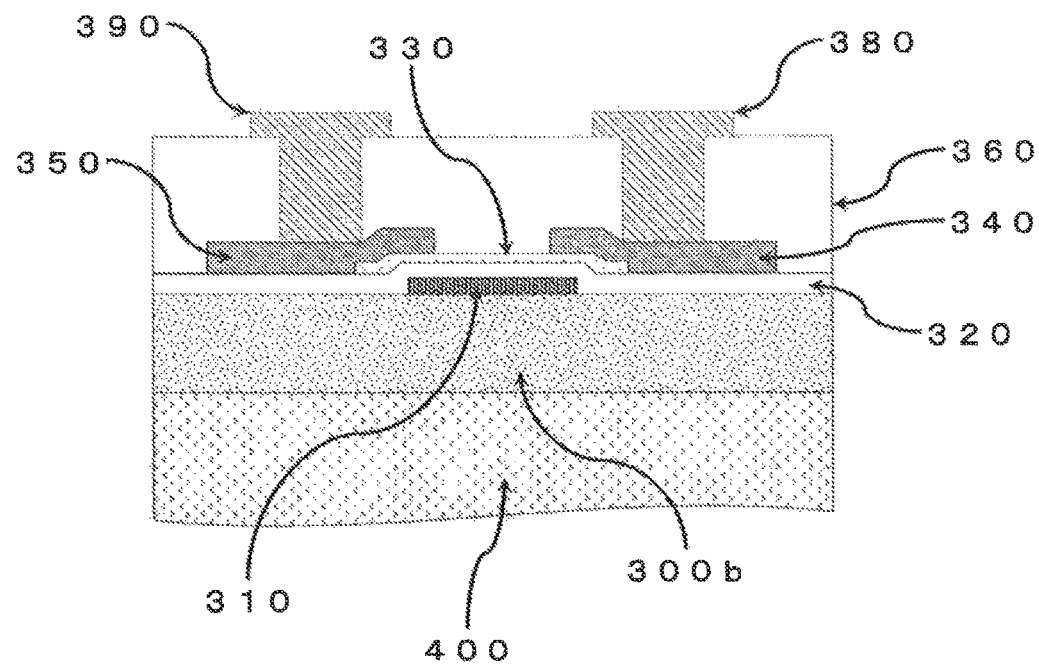
Figure 4C:
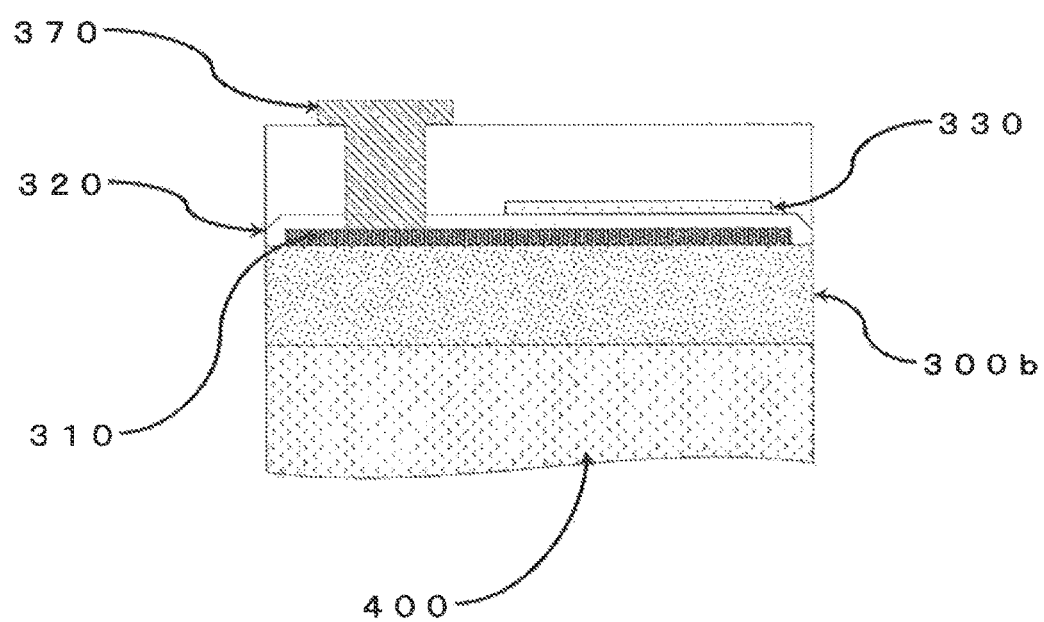

FIG. 4a is a top view of the organic TFT 300. The cross-sectional structures taken along lines A and B in the diagram are shown in FIGS. 4b and 4c. In the present working example, the organic TFT 300 has adopted a bottom-gate, top-contact type structure, and is formed by using an organic TFT process on a substrate in which a polyimide-base thin film 300b is attached to a glass substrate 400. In FIGS. 4a, 4b, and 4c, a gate electrode 310, a gate insulating film 320, an organic semiconductor 330, a source electrode 340, a drain electrode 350, an insulating cover film 360, a gate electrode lead-out via metal 370, a source electrode lead-out via metal 380, and a drain electrode lead-out via metal 390 are shown.

Figure 5:
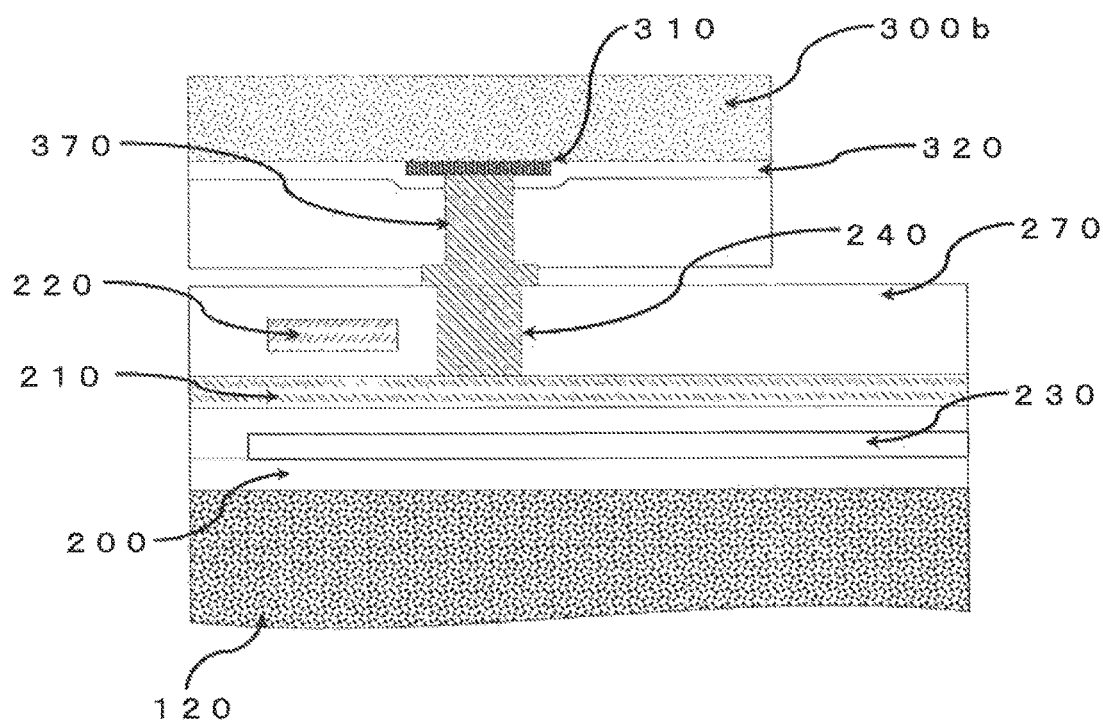
FIG. 5 is a cross-sectional view, seen along line C, of a state in which the matrix element control circuit is mounted on a matrix element.
Figure 6:
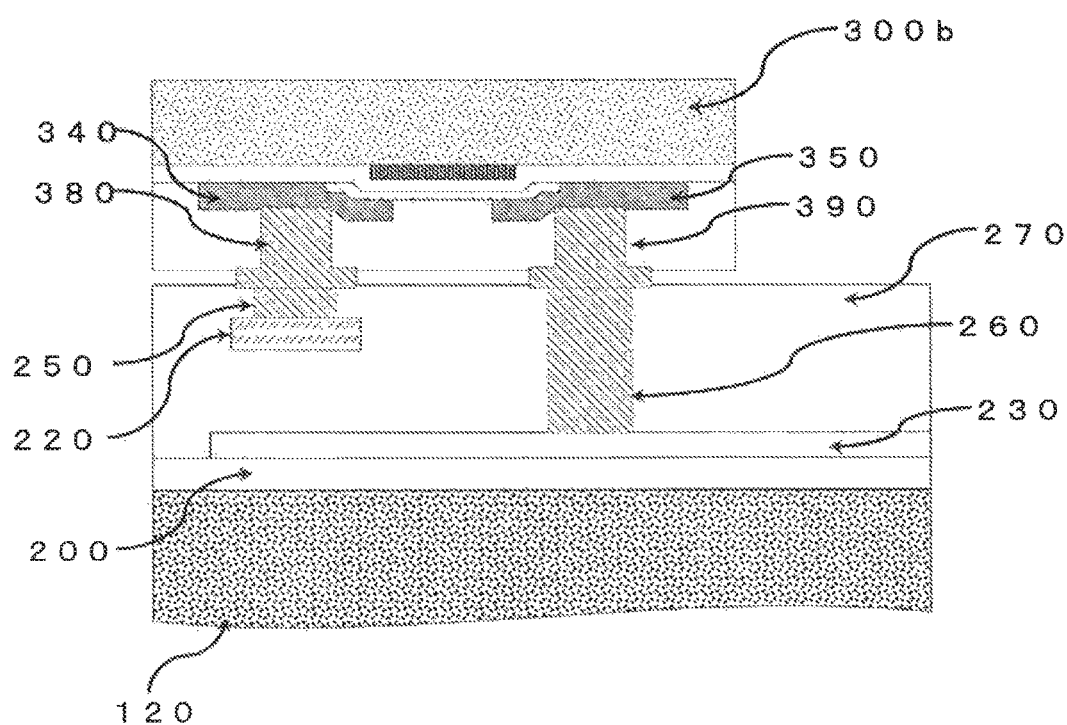
FIG. 6 is a cross-sectional view, seen along line D, of a state in which the matrix element control circuit is mounted on a matrix element.

The organic TFTs formed on the glass substrate 400 are separated one by one by dicing or the like. At this time, the glass substrate is not completely cut, and incisions are formed in the polyimide-base thin film 300b and a layer of organic TFTs thereabove. Portions of the polyimide-base thin film 300b and thereabove are peeled off from the glass substrate 400 as the organic TFTs 300, and are mounted on the active matrix array device body 100, FIGS, 5 and 6 are diagrams illustrating a state in which an organic TFT is mounted on the liquid crystal display panel 100, and the electrodes of the organic TFT are connected to interconnects and a pixel electrode of the liquid crystal display panel 100, and respectively show cross-sectional structures taken along lines C and D shown in FIG. 2. The gate electrode 310 is connected to the gate line 210 via a gate electrode lead-out via 370 and a gate line connection via metal 240. The source electrode 340 is connected to the data line 220 via a source lead-out via metal 380 and a data line connection via metal 250. The drain electrode 350 is connected to the pixel electrode 230 via a drain electrode lead-out via metal 390 and a pixel electrode connection via 260. An alignment film 200 and an insulating layer 270 are also shown in FIGS. 5 and 6.

Functions and Effects

In the present working example, the organic TFT that control the respective pixels are formed on a substrate that is different from that of the liquid crystal display body, and therefore the organic TFTs are not necessarily formed on one substrate. A method can be adopted in which the necessary number of sheets of the organic TFTs are manufactured using a substrate having a size at which the highest manufacturing efficiency can be obtained. Also, when the number of pixels is fixed, the cost related to manufacturing the organic TFTs is fixed irrespective of the display size. The effect is obtained in that the cost related to the TFT does not change even if the screen size of a display for outdoor use is 100 inches or 400 inches.

Meanwhile, in the present working example, it is not essential to use a glass substrate, and a display can be manufactured using a roll-to-roll method or a printing technique in combination with the manufacturing method of the present invention. Accordingly; the weight of the conventional active matrix array type display can be reduced and the size thereof can be increased.

The invention claimed is:

1. A method for manufacturing an active matrix array device in which a plurality of row interconnects and a plurality of column interconnects that mutually orthogonally intersect and a plurality of matrix elements that are arranged in a vertical direction and a horizontal direction are formed on an active matrix substrate, the method for manufacturing an active matrix array device comprising:

forming a plurality of control circuits for the matrix elements on a common film on a substrate that is different from the active matrix substrate;

separating each of the plurality of control circuits along with a corresponding portion of the film from the different substrate; and arranging the separated plurality of control circuits respectively on regions in each of which a matrix element is to be formed on the active matrix substrate, and connecting the row interconnects and the column interconnects to corresponding electrode portions of the matrix elements, wherein the separated control circuit is arranged on the active matrix substrate with the film facing away from the active matrix substrate.

2. The method for manufacturing an active matrix array device according to claim 1, wherein a predetermined operation test is performed on each of the control circuits, and only good control circuits are selected and arranged on the active matrix substrate.

3. The method for manufacturing an active matrix array device according to claim 1, wherein the control circuits are each an organic TFT formed of an organic semiconductor.

4. The method for manufacturing an active matrix array device according to claim 1, wherein the different substrate is constituted by attaching the film to a glass substrate, and when the control circuits are separated along with the film, the control circuits along with the film are peeled off from the glass substrate without the glass substrate being completely cut.

5. An active matrix array device manufactured by the method according to claim 1.

6. The method for manufacturing an active matrix array device according to claim 1, wherein the active matrix substrate on which the separated control circuit is arranged comprises a gate line connection, a data line connection, and a pixel electrode, the control circuit comprises a gate electrode, a source electrode, and a drain electrode, and the separated control circuit is placed face down on the active matrix substrate so that the gate electrode is electrically connected with the gate line connection, the source electrode is electrically connected with the data line connection, and the drain electrode is electrically connected with the pixel electrode.

* * * * *